United States Patent
Gage et al.

(10) Patent No.: US 7,379,395 B2
(45) Date of Patent: May 27, 2008

(54) PRECISE TIME MEASUREMENT APPARATUS AND METHOD

(75) Inventors: Robert Bruce Gage, Beaverton, OR (US); Jacob Alvin Salmi, Andover, MN (US)

(73) Assignee: Teradyne, Inc., Boston, MA (US)

( * ) Notice: Subject to any disclaimer, the term of this patent is extended or adjusted under 35 U.S.C. 154(b) by 503 days.

(21) Appl. No.: 10/881,373

(22) Filed: Jun. 30, 2004

(65) Prior Publication Data
US 2006/0002239 A1   Jan. 5, 2006

(51) Int. Cl.
*G04F 10/00* (2006.01)

(52) U.S. Cl. ............... 368/118; 702/177; 702/176; 714/724; 714/815; 324/765

(58) Field of Classification Search ........ 368/118–121; 702/176, 177; 714/724, 815; 324/765
See application file for complete search history.

(56) References Cited

U.S. PATENT DOCUMENTS

| | | | |
|---|---|---|---|
| 4,660,197 A | | 4/1987 | Wrinn et al. |
| 5,710,517 A | * | 1/1998 | Meyer ................. 327/163 |
| 5,917,834 A | * | 6/1999 | Arkin ................. 714/724 |
| 5,948,115 A | * | 9/1999 | Dinteman ............. 714/738 |
| 6,029,261 A | * | 2/2000 | Hartmann ............. 714/724 |
| 6,060,898 A | * | 5/2000 | Arkin ................. 324/765 |
| 6,188,253 B1 | | 2/2001 | Gage et al. |
| 6,609,077 B1 | | 8/2003 | Brown et al. |
| 6,622,107 B1 | | 9/2003 | West |
| 7,171,602 B2 | * | 1/2007 | Gomes et al. .......... 714/744 |
| 2003/0208717 A1 | | 11/2003 | Klotchkov et al. |
| 2004/0047243 A1 | * | 3/2004 | Krageorge ............. 368/28 |

FOREIGN PATENT DOCUMENTS

EP   1 550 934 A   7/2005

OTHER PUBLICATIONS

Search Report received in Application No. PCT/US2005/023088.
Teradyne J973 VLSI Test System Programming Guide, Dec. 2001, pp. 1-30.

* cited by examiner

*Primary Examiner*—P. Austin Bradley
*Assistant Examiner*—Thanh S Phan
(74) *Attorney, Agent, or Firm*—Wolf, Greenfield & Sacks, P.C.

(57) ABSTRACT

A time measurement system that uses two signals generated by direct digital synthesis. The generated signals have the same frequency but different phase. One signal is used to identify the start of the measurement interval and the other signal is used to identify a measurement window in which a signal indicating the end of the measured interval might be detected. The time measurement system is used as part of a time domain reflectometry (TDR) system. An incident pulse is synchronized to the first signal and launched down on a line. In the measurement window, the signal on the line is compared to a threshold value to determine whether the pulse has been reflected and traveled back to the source. By iteratively repeating the measurement with a different measurement window, the time of arrival of the reflected pulse can be determined. This time domain reflectometry approach is incorporated into automatic test equipment for testing semiconductor devices and is used to calibrate the test equipment.

20 Claims, 6 Drawing Sheets

PRECISE TIME MEASUREMENT APPARATUS AND METHOD

BACKGROUND OF INVENTION

1. Field of Invention

This application relates generally to test and measurement equipment and more specifically to calibration of systems for making time dependent measurements.

2. Discussion of Related Art

Automated test equipment (a "tester") is widely used in the manufacture of semiconductor devices. Devices are tested at least once, and often multiple times, during their manufacture. The results of the test can be used to remove defective devices from the stream of devices being manufactured. In some cases, test results reveal improperly operating manufacturing equipment and can be used to increase the yield of semiconductor devices by identifying process corrections. In other cases, the test results reveal corrections that can be made to the devices under test. For example, memories, programmable array logic devices and similar devices often contain redundant structures. If testing reveals that one structure is defective, the device can be modified to substitute a redundant structure for the defective one. In other situations, the test results can be used for "binning" the parts. A device that does not meet its intended operating specifications, but does operate properly against degraded specifications, might be packaged and sold at a lower price with lower performance specifications. For example, a device might exhibit errors when operating at a high speed, but perform properly when operated at a lower speed. Similarly, a device might exhibit errors when operated at the high end of its temperature range, but perform adequately at a lower temperature. These devices could be packaged and sold with indications that their maximum operating speed or temperature is lower than the design specification.

To detect errors in operation of semiconductor devices, automatic test equipment applies stimulus signals to the device and measures response signals. Test equipment includes many "channels." Each channel can, in any cycle, either generate or measure a digital value to be applied to one test point on the device under test. Channels might include additional circuitry that can generate or measure other kinds of signals. For example, some channels contain circuitry that generates a continuous clock of a programmed frequency or circuitry that measures the time difference between successive pulses.

Figure 1:
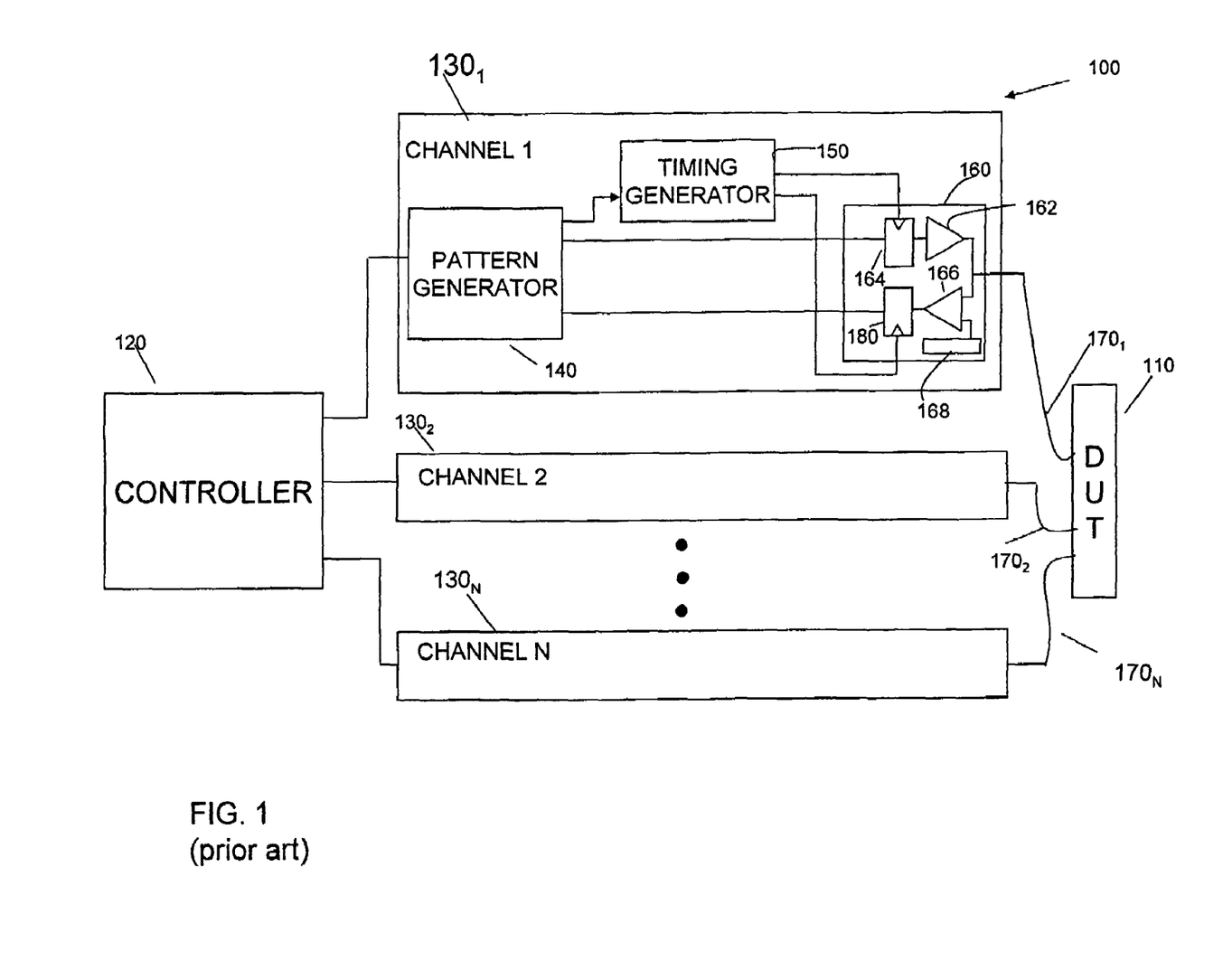
FIG. 1 is a block diagram illustrating a tester as might be found in the prior art.

FIG. 1 illustrates, in greatly simplified form, a tester 100. Tester 100 is shown testing a device under test (DUT) 110. Tester 100 contains a central controller 120. Controller 120 might include a computer work station that serves as an operator interface to allow a user to develop or load test programs into the tester. Controller 120 might also include a tester body that provides centralized resources that are used by multiple channels or are not related to circuitry in the channels, but details of such known features are omitted for simplicity.

Tester 100 includes multiple channels, $130_1$, $130_2$, . . . $130_N$. Taking channel $130_1$ as representative, each channel can has a pattern generator 140 and a timing generator 150. Pattern generator 140 is programmed to specify, for each cycle during a test, what the circuitry within channel $130_1$ should do. For example, it might specify a value to drive to DUT 110 or what value is expected from DUT 110.

Timing generator 150 produces timing signals that control the times at which signal transitions occur. For example, a timing signal might specify the beginning of a signal being generated or the time at which a signal value is compared to an expected value. To fully test DUT 110, it is important to control the times at which stimulus signals are applied and the times at which the responses are measured. Timing generator 150 provides signals that control these functions.

Channel $130_1$ also includes pin electronics 160. Pin electronics 160 contains the circuitry that drives the line $170_1$ connected to DUT 110 or measures the signal value on that line.

To drive line $170_1$, pin electronics 160 includes a driver 162. Driver 162 is connected to a flip-flop 164. Flip-flop 164 is in turn clocked by a signal from timing generator 150. The data input to flip-flop 164 is provided by pattern generator 140. Flip-flop 164 causes a value specified by pattern generator 140 to be driven onto line $170_1$ at a time specified by timing generator 150. Flip-flop 164 might be termed a "formatter." Formatters are known in the art and a full formatter, including all of the features commonly found in a tester, is not shown for simplicity.

To sense a signal on line $170_1$, pin electronics 160 includes a comparator 166. One input of comparator 166 is connected to line $170_1$. A reference input of comparator 166 is coupled to a programmable reference value generator—typically a register storing a digital input that is applied to a digital to analog converter. The output of comparator 166 is provided to a latch 180. Latch 180 is controlled by a timing signal generated by timing generator 150. The data output of latch 180 is provided to pattern generator 140. In this way, pin electronics 160 indicates whether the value on line $170_1$ has a particular value at a time dictated by signals from timing generator 150. As with the driver portion of pin electronics 160, the comparator portion is well known in the art and a simplified version is shown.

Timing generator 150 provides signals that control the relative timing of signals at pin electronics 160. To accurately measure the performance of DUT 110, it is necessary to relate the times at which signals are generated or measured at pin electronics 160 to the times those signals reach or leave DUT 110. The transit time through line $170_1$ must be considered.

To compensate for this transit time, a tester is typically calibrated. To calibrate a tester, measurements are made to determine the transit time through line $170_1$. Programmed time values are offset by an amount to compensate for the transit time through line $170_1$. With calibration, the signals generated or measured at pin electronics 160 are an accurate indication of signals at DUT 110.

Figure 2:
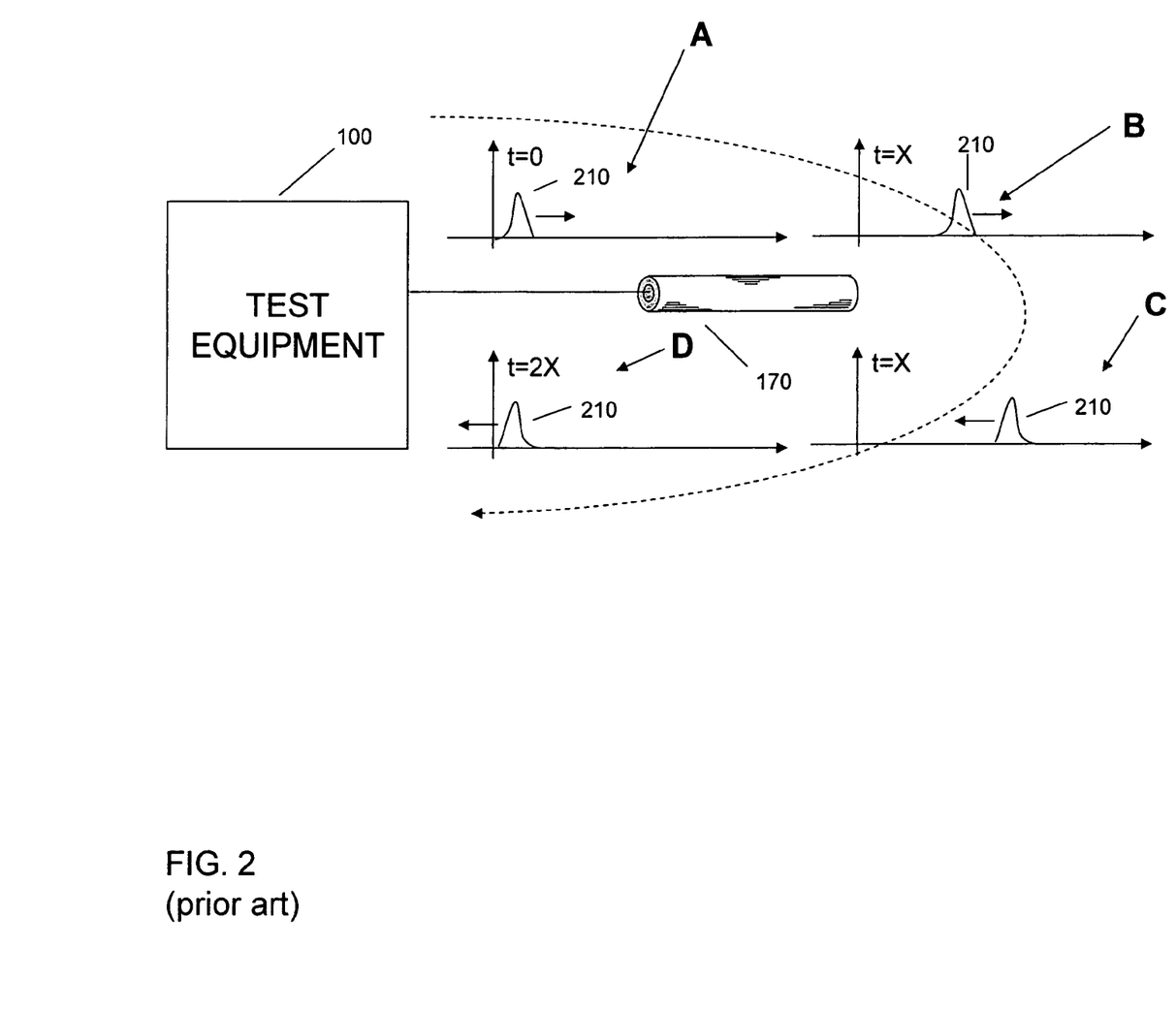
FIG. 2 is a sketch illustrating a known TDR measurement.

One way in which the transit time through line $170_1$ is measured is through a technique called Time Domain Reflectometry (TDR). TDR is illustrated in FIG. 2. To make a TDR measurement, test equipment 100 transmits a pulse 210 on line $170_1$. The pulse is transmitted at a time t=0, as indicated at A.

Pulse 210 travels down line $170_1$ until it reaches the end of the line at some time later, indicated at B as t=X. When the line is un-terminated or terminated in a short or any other load that is not matched to the impedance of the line, some or all of the pulse will reflect back towards test equipment 100. As shown at C, pulse 210 begins to travel back towards test equipment 100.

As shown at D, at time t=2x, pulse 210 reaches test equipment 100. By detecting the time of the reflected pulse relative to the time that the pulse was transmitted, test equipment 100 can determine the transit time through line $170_1$.

Figure 3A:
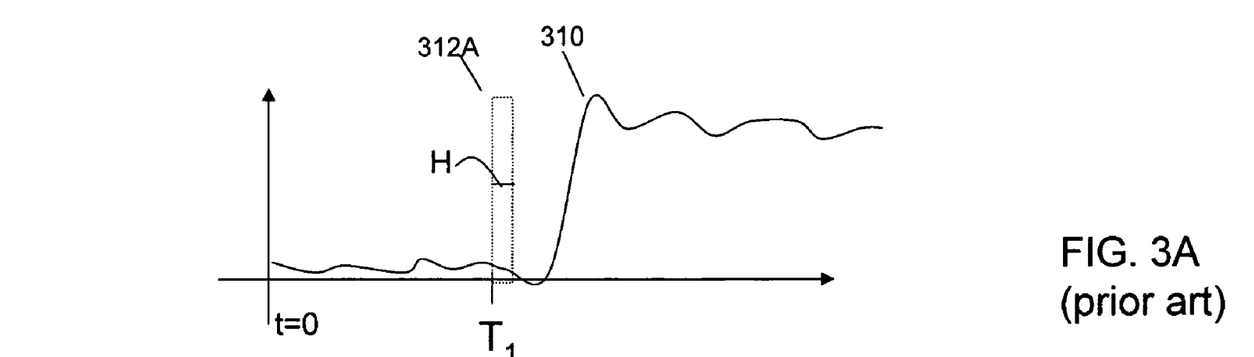
FIGS. 3A . . . 3C are a series of sketches illustrating a known "edge find" algorithm for measuring the timing of a signal.
Figure 3B:
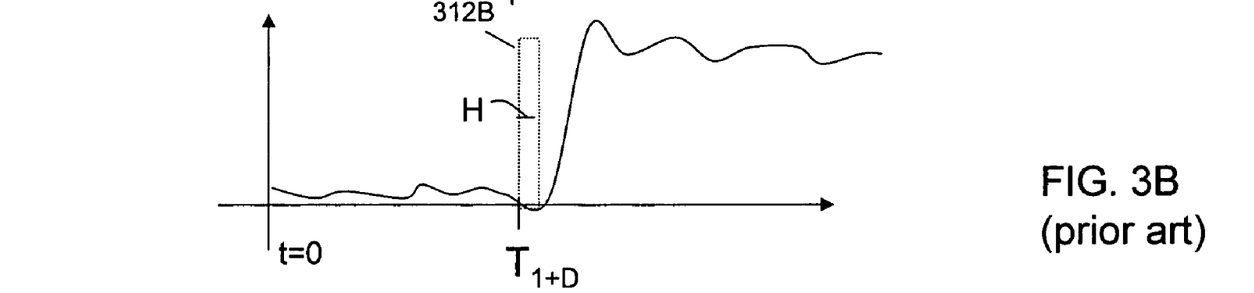

FIGS. 3A . . . 3B illustrate a measurement technique by which tester 100 may determine the time of an edge of a signal, which might be used to determine the time of arrival of a pulse. This technique is sometimes called an "edge find" technique. The tester is programmed with a threshold H in register 168 (FIG. 1). The tester emits a pulse at a time that can be taken to be t=0. At some time later, latch 180 latches the output of comparator 166.

As illustrated in FIG. 3A, the tester issues the latch command at a time $T_1$ relative to the transmission of the pulse. Latching comparator 166 at time T1 has the effect of a very coarse measurement of the value of the signal on line $170_1$ in the window 312A. From this single comparison, tester 100 may determine whether the signal at time $T_1$ is above or below threshold H.

In the window 312A, the pulse 310 has not reached tester 100 and the signal on line $170_1$ is below the threshold H. Accordingly, tester 100 determines that at time $T_1$, the signal on line $170_1$ is LO, which is interpreted as an indication that pulse 310 has not yet reached pin electronics 160.

Another pulse is then transmitted at a time which may again be considered time t=0. FIG. 3B illustrates a measurement made at a time $T_{1+D}$ relative to the transmission of the pulse. In measurement window 312B, pulse 310 has not reached tester 100 and the signal is again below the threshold H. This measurement is indicated by a logical LO latched at the output of comparator 166.

Figure 3C:
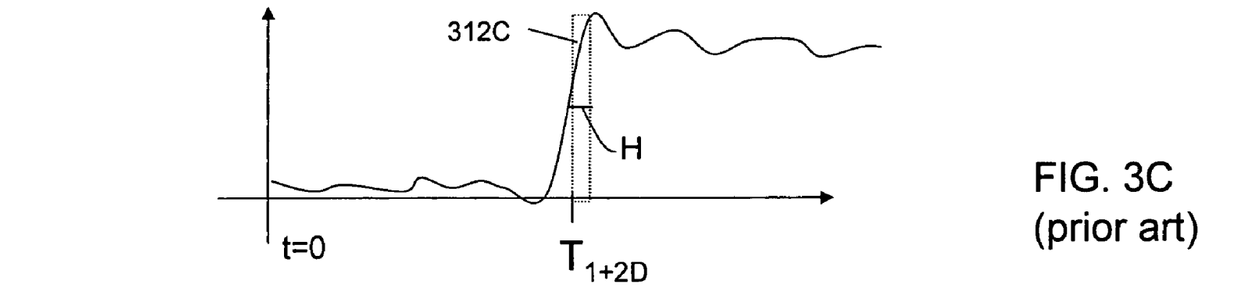

FIG. 3C illustrates a measurement made at a time $T_{1+2D}$ relative to the transmission of another pulse. In the measurement window 312C, the pulse 310 has reached tester 100 and the signal is above the threshold H. Tester 100 indicates this signal level as a logical HI.

This series of measurements allows tester 100 to determine that a pulse 310 transmitted by tester 100 will reflect and reach tester 100 at a time between $T_{1+D}$ and $T_{1+2D}$ after it is transmitted. This information allows calculation of the signal transit time through line $170_1$. The signal transmit time allows tester 100 to be calibrated to remove any errors in time measurements caused by signal delays in line $170_1$.

Calibration using TDR is very convenient because TDR measurements are made using circuitry that is in tester 100 for testing DUT 110. However, the calibration indicates that pulse 310 arrived at some time between $T_{1+D}$ and $T_{1+2D}$. If D is the smallest increment at which timing generator 150 can specify test signals, this value limits the resolution of calibration measurements. It would be desirable to calibrate a tester with as much precision as possible. It would also be desirable to calibrate a tester using circuitry that is be present in a tester for other measurements.

Figure 4:
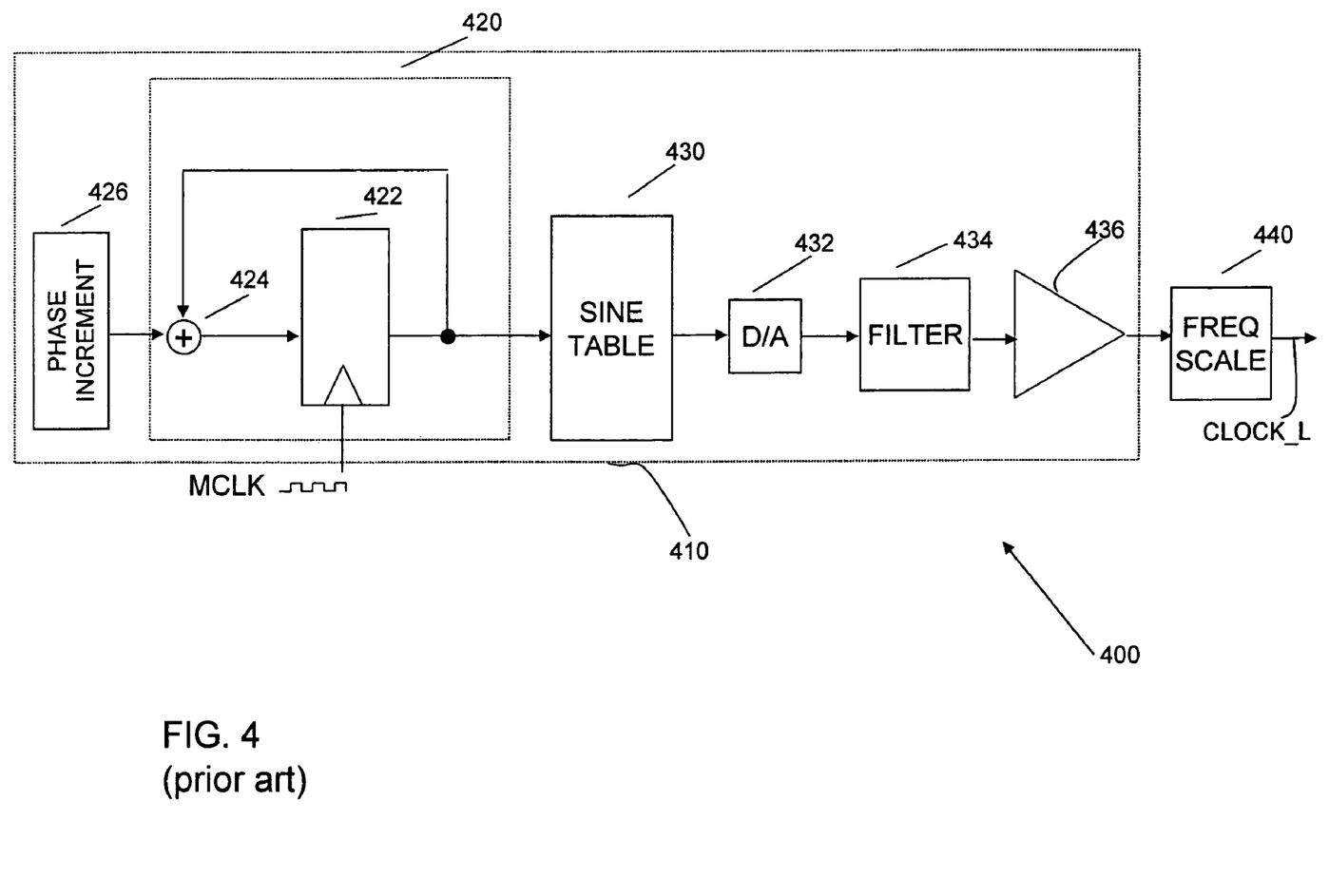
FIG. 4 is a block diagram of a prior art clock generation circuit.

FIG. 4 is a sketch of programmable clock generation circuitry, such as might be found in a tester, but has not heretofore been used for timing calibration. Clock generation circuit 400 uses a technique sometimes called direct digital synthesis (DDS) to generate a clock, CLOCK_L, that has a programmable frequency. Clock generation circuit 400 is clocked by a clock signal MCLK. MCLK is usually a fixed frequency clock. It is made to be relatively low frequency, around 100 MHz, so that it can be accurately distributed throughout tester 100. More details of the design and use of such a clock generation circuit may be found in U.S. Pat. No. 6,188,253 to Gage, et al., entitled ANALOG CLOCK MODULE, which is hereby incorporated by reference in its entirety.

Clock generation circuit 400 includes a Numeric Counter Oscillator (NCO) 410. More details of design and use of an NCO may be found in pending U.S. patent application Ser. No. 10/748,488, filed Dec. 29, 2003, which is hereby incorporated by reference in its entirety.

NCO 410 includes an accumulator 420. Accumulator 420 includes a register 422 that is clocked by MCLK. The input of register 422 comes from adder 424. Adder 424 computes the sum of the value previously stored in register 422 and a value stored in a register 426.

The output of accumulator 420 is used to address a memory denoted sine table 430. Sine table 430 stores a sequence of samples of a periodic signal, usually a sine wave. As the values in accumulator 420 increase, the sine table outputs samples that correspond to points on that sine wave. The values in the sequence represent points on the sine wave that are successively later in phase. Thus, the value in accumulator 420 indicates the phase of the sine wave at a particular point in time.

The value in register 426 indicates the amount by which the phase increases from sample to sample. Accordingly, changing the value in register 426 changes the rate of the change of the phase, i.e., frequency, of the output waveform.

The samples of a sine wave provided by sine table 430 are input to digital to analog converter 432. The analog output of converter 432 is applied to filter 434. Filter 434 is a smoothing filter, creating an analog signal which is as close to a pure sine wave as is practical.

The sine wave is then supplied to clipping amplifier 436. Clipping amplifier 436 is a high gain amplifier that turns the sine wave into a square wave.

The square wave out of clipping amplifier 436 can serve as a digital clock with a frequency that can be programmed by changing the value in register 426. However, NCO 420 has a limited resolution with which a frequency can be programmed. The resolution depends on factors such as the number of bits of resolution of register 426 and the number of samples of a sine wave stored in sine table 430.

Where greater resolution is desired, a frequency scaling circuit 440 can be used. Often, a phase locked loop (PLL) is used as a frequency multiplier. The phase locked loop can multiply the frequency by an integer amount, which can be programmed. A counter can be used as a frequency divider. A counter can divide the frequency by an integer amount, which also can be programmed. A frequency multiplier and frequency divider can be used together to scale the frequency out of NCO by non-integer amounts equal to the ratio between the frequency multiplication provided by the PLL and the frequency division by the counter.

The block diagram of FIG. 4 is a simplified block diagram of a clock generation circuit. Conventional elements of such a circuit are not expressly shown. For example, circuitry to load register 426 is not shown. Likewise, circuitry to reset or load accumulator register 422 is not shown. However, such circuitry would be routinely included in a clock generation circuit of the type pictured.

While clock generation circuits as shown in FIG. 4 are known, such circuits have not heretofore been used in the manner described below. Moreover, it would be highly desirable to provide time measurements with very high precision and particularly advantageous to make high resolution measurements with circuitry as conventionally found in a tester.

SUMMARY OF INVENTION

In one aspect, the invention relates to time measurement apparatus that has a first clock generation circuit outputting a first clock signal and a second clock generation circuit outputting a second clock signal. The first clock generation circuit comprising a first numeric counter oscillator and the second clock generation circuit comprising a second numeric counter oscillator. A clock input is coupled to the first numeric counter oscillator and the second numeric counter oscillator. The clock input controls the rate at which the first numeric counter oscillator and the second numeric counter oscillator increment. At least one sequencer controls the operation of the time measurement apparatus. The sequencer(s) generate a first control signal synchronized to the first clock signal and a second control signal synchronized to the second clock signal.

In another aspect, the invention relates to test equipment having a test point adapted to be connected to at least one line. The test equipment has a driver circuit with an output coupled to the test point and a timing input controlling the time at which the driver drives a signal at the test point. A comparator circuit has an input coupled to the test point and a timing input controlling the time at which the comparator circuit measures the value of a signal at the test point. A first circuit includes a first numeric counter oscillator and has an output coupled to the timing input of the driver circuit. A second circuit includes a second numeric counter oscillator and has an output coupled to the timing input of the comparator circuit. A conductor carries a synchronization signal between the first circuit and the second circuit.

In another aspect, the invention relates to a method of measuring a time difference. The method comprises generating a first clock having a first frequency, the frequency controlled response to at least one value. A second clock is generated to have a second frequency, correlated to the first frequency, with the frequency and phase of the second clock relative to the phase of the first clock being controlled, in response to at least one digital value. A measurement interval is started synchronized to the first clock and ended synchronized to the second clock.

Apparatus and method according to the invention might be employed in automatic test equipment, such as to make TDR measurements.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 5:
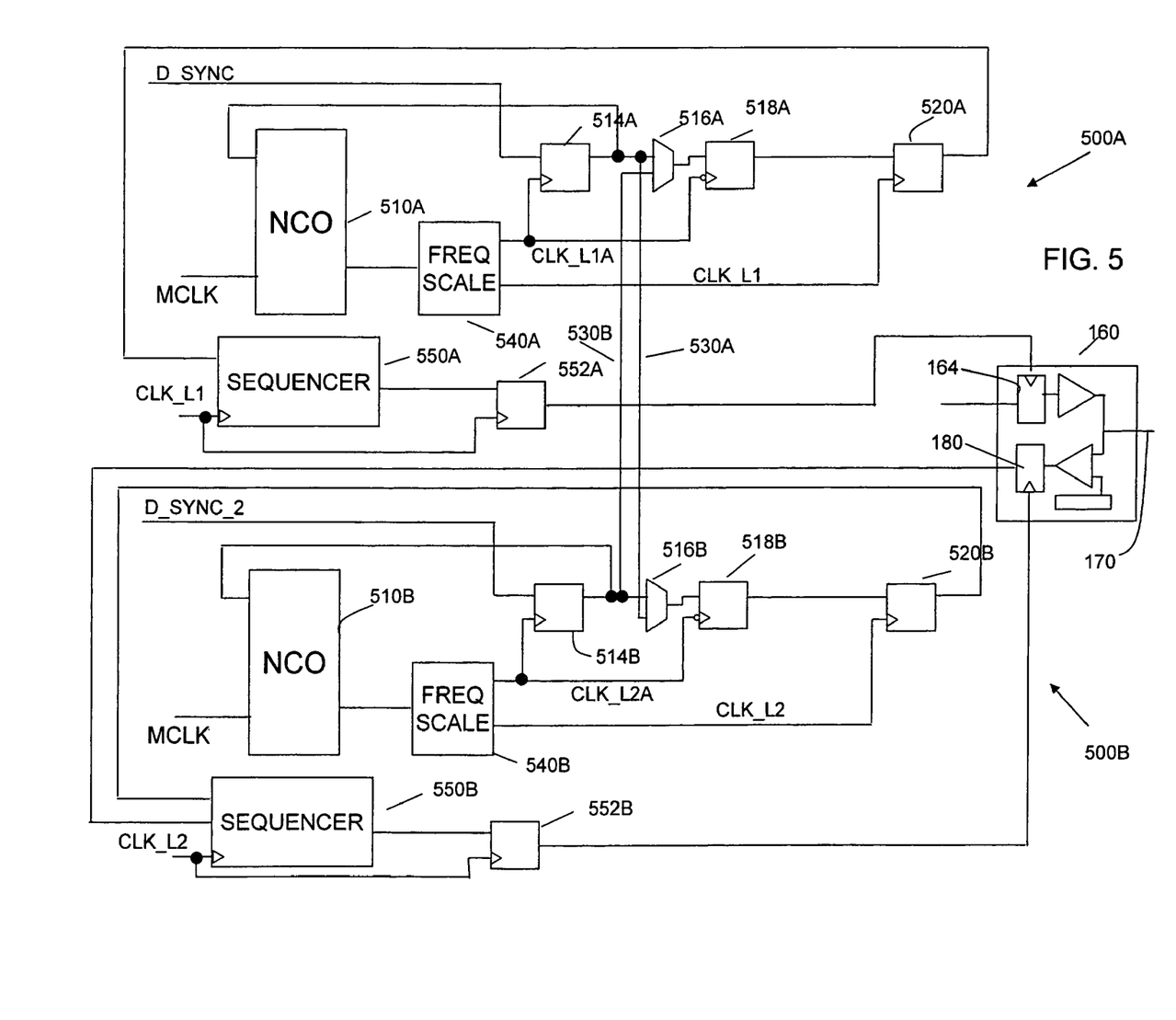
FIG. 5 is a block diagram of a time measurement circuit incorporating the invention.

FIG. 5 illustrates circuitry that may be used to make a timing measurement that is more precise than prior art approaches. Time measurements with resolutions on the order of fem to seconds are readily achievable using circuitry as conventionally found in a tester. Even higher resolution measurements are possible with higher resolution circuitry. In the illustrated embodiment, the circuitry is used to make a TDR measurement, such as might be used for calibrating a test system.

The time measurement circuit includes pulse generation circuits 500A and 500B. Pulse generation circuit 500A generates a pulse that controls the time at which a pulse is transmitted at the start of a time measurement. The pulse from circuit 500A clocks latch 164 in pin electronics 160. The source of the data input to latch 164 is not shown in FIG. 5. However, it may be set by any convenient means to a logical value that causes a pulse to be generated when latch 164 is clocked. Accordingly, the signal from pulse generation circuit 500A can be taken as establishing time t=0, as illustrated in FIGS. 3A . . . 3B. The specific method by which the data input to latch 164 is set is not critical. It might, for example, be set by pattern generator 140 (FIG. 1).

Pulse generation circuit 500B generates a pulse that controls a measurement window, such as 312A . . . 312C in FIGS. 3A . . . 3C. This pulse clocks latch 180 within pin electronics 160. The output of latch 180 runs to sequencer 550B. As will be described in greater detail below, the time measurement circuit of FIG. 5 executes an edge find algorithm. Sequencer 550B monitors the output of latch 180 to determine when the edge has been detected. Advantageously, the relative timing of the signals from pulse generators 500A and 500B can be very precisely timed for a very precise time measurement. Pulse generation circuit 500A receives a signal identified as D_SYNC. D_SYNC is a command that causes pulse generation circuits 500A and 500B to synchronize to each other. The signal D_SYNC might, for example, be derived from a command from a pattern generator 140. Pulse generation circuit 500B is structurally similar to pulse generation circuit 500A. Circuits 500A and 500B operate together to define the beginning and the end of a measurement interval.

Pulse generation circuit 500A includes NCO 510A. NCO 510A may be an NCO as is known in the art, such as NCO 410 (FIG. 4). NCO 510A is clocked by a reference clock MCLK and generates a digital clock of programmable frequency. The clock produced by NCO 510A is passed to frequency scaling circuit 540A. Frequency scaling circuit 540A produces multiple clocks, all at frequencies that are an integer or non-integer multiple of the frequency out of NCO 510A. The clocks are all generated from the same source and are therefore correlated in time. Frequency scaling circuit 540A may be a frequency scaling circuit as is known in the art, such as frequency scaling circuit 440 (FIG. 4). The specific frequency at which NCO 510A generates a clock signal is not crucial to the invention.

A time measurement is initiated with the assertion of the D_SYNC signal. In the illustrated embodiment, the D_SYNC signal is assumed to be in the same clock domain as the clocks output by frequency scale circuit 540A. A "clock domain" refers to circuits that are timed by a single clock or a set of clocks that are correlated signals. In digital design, it is preferable that inputs to a circuit occur at times correlated to the clock that times operations within that circuit. Otherwise, the circuit might perform an operation before the input signal is applied or might operate at a time after the input has changed state. This lack of synchronization can produce unintended results. Accordingly, when a signal generated in one time domain is passed to circuitry in another time domain, it is conventional to synchronize the signal to the new time domain, such as by latching the signal with a clock synchronized with the new time domain are said to be in a clock domain if they occur at times correlated to the clocks that time the circuitry of the time domain.

As regards the circuit of FIG. 5, the outputs of NCO 510A and 510B are likely not in the same time domain as the circuit that initiates a command to start a time measurement. Some synchronization might be employed. However, the specific method of synchronization by which the D_SYNC signal is generated from a command is not critical to the invention and the details of that synchronization are not shown.

The D_SYNC signal is provided as an input to the flip-flop 514A. Flip-flop 514A is clocked by CLK_L1A produced by frequency scaling circuit 540A. Flip-flop 514A aligns the D_SYNC signal with CLK_L1A.

The output of flip-flop 514A is provided as one of the switched inputs to multiplexer 516A. The control inputs to multiplexer 516A are not expressly shown. However, for a time measurement, multiplexer 516A preferably will be controlled to pass the output of flip-flop 514A to the input of flip-flop 518A. A second switched input of multiplexer 516A is connected pulse generation circuit 500B. This connection allows the D_SYNC signal to be replaced by a synchronization signal from pulse generation circuit 500B. This alternative connection is not required for normal time measurements, and multiplexer 516A might be omitted entirely. However, the alternative connection can be used for debugging and including a multiplexer 516A allows circuits 500A and 500B to include identical hardware.

Flip-flop 518A is clocked by the logical inverse of the clock provided to flip-flop 514A. Flip-flop 518A is included in the pulse generation circuit so that circuits 500A and 500B will be symmetrical. It might also be used for debugging the circuit.

The output of flip-flop 518A is provided to flip-flop 520A. Flip-flop 520A is clocked CLK_L1 from frequency scaling circuit 540A. The frequency of this clock matches the frequency of the clock driving sequencer 550A. In the illustrated embodiment, sequencer 550A is clocked at a frequency that is 4 times the frequency of MCLK. Flip-flop 520A ensures that the D_SYNC signal arrives at sequencer 550A at a time synchronized to the clock clocking sequencer 550A.

The output of flip-flop 520A serves as a start signal to sequencer 550A. Sequencer 550A generates an output signal that is passed to flip-flop 552A.

Flip-flop 552A is clocked by CLK_L1 and its output is therefore synchronized with that clock. The output of flip-flop 552A is provided to pin electronics 160 to control the generation of an output pulse. The data input to pin electronics 160 is not shown, but is preferably set, such as by pattern generator 140, to a logic HI value before pattern generator issues the D_SYNC signal that starts the time measurement.

Flip-flop 552A is shown to be connected to the clock input of flip-flop 164 within pin electronics 160. As described above, flip-flop 164 represents a formatter or other circuitry that controls pin electronics 160 to generate the required signals. Consequently, a pulse such as the pulse 210 (FIG. 2) is transmitted in response to flip-flop 552 being asserted.

Accordingly, the pulse is sent a time controlled by circuit 500A. That time is controlled by CLK_L1.

Pulse generation circuit 500B generates a pulse that controls flip-flop 180. The pulse generated by pulse generation circuit 500B controls the timing of a measurement window, such as 312A . . . 312C in FIGS. 3A . . . 3C.

Pulse generation circuit 500B may be structurally similar to pulse generation circuit 500A. It contains an NCO 510B that is preferably constructed the same as NCO 510A. Pulse generation circuit 500B also includes a frequency scaling circuit 540B that is similar to the frequency scaling circuit 540A.

Preferably, NCO 510B is programmed to generate a signal of the same frequency as NCO 510A. However, the phase of the signal produced by NCO 510B is offset from the phase of the signal produced by NCO 510A. Producing two signals with a relative phase difference can be achieved by starting NCO 510A and NCO 510B at the same time with different initial values stored in their accumulators, such as register 422 (FIG. 4).

Pulse generation circuit 500B includes flip-flop 514B, that receives a signal D_SYNC_2. In the illustrated embodiment, both pulse generation circuits 500A and 500B are synchronized by D_SYNC. The D_SYNC_2 input is provided for symmetry between pulse generator circuits 500A and 500B and as a debug aid.

Multiplexer 516B is similar in construction to multiplexer 516A. Multiplexer 516B receives as switched inputs the outputs of flip-flops 514A and 514B. For a timing measurement, multiplexer 516B will be configured to switch the output of flip-flop 514A to the input of flip-flop 518B. Switching the output of flip-flop 514A to the inputs of both flip-flops 518A and 518B ensures that both pulse generation circuit 500A and 500B receive a synchronization signal from the same source.

The output of flip-flop 518B represents the start pulse synchronized to clock CLK_L2A generated by NCO 510B and frequency scaling circuit 540B. Preferably CLK_L1A and CLK_L2A have the same frequency.

The output of flip-flop 518B is coupled to the data input of flip-flop 520B. Flip-flop 520B is clocked by clock CLK_L2 produced by NCO 510B and frequency scaling circuit 540B. In the illustrated embodiment, this clock has a frequency that is four times the frequency of CLK_L2A. It matches the frequency at which sequencer 550B is clocked.

Sequencer 550B may be implemented with sequential logic circuitry as is known in the art. It monitors the digital value in NCO 510B, such as in an accumulator register 422 (FIG. 4). Sequencer 550B monitors this value until it detects a value indicating time has passed from the transmission of a pulse to a desired measurement window such as 312A . . . 312C in FIG. 3. If the value in the accumulator register 422 overflows in that time, sequencer 550B counts the number of overflows. In this way, the duration of the time measurement is not limited by the number of bits in accumulator register 422.

The amount of time that sequencer 550B tracks is programmable. At the end of the programmed interval, sequencer 550B outputs a pulse to flip-flop 552B. Flip-flop 552B is clocked by a clock generated by NCO 510B and frequency scaling circuit 540B. Accordingly, the output pulse of flip-flop 552B will be synchronized with that clock, including any phase offset that was introduced by the initial setting of NCO 510B.

The output of flip-flop 552B is provided to flip-flop 180 within pin electronics 160. It controls the timing of the comparison operation. In the context of the measurement illustrated in FIGS. 3A ... 3C, sequencer 550B sets the time of the measurement window.

In the illustrated embodiment, the output of flip-flop 180 is provided to sequencer 550B. Sequencer 500B determines whether the output of pin electronics indicates a value that represents an edge at the end of the time interval being measured. Sequencers 550A and 5501B control a tester 100 to perform the functions described in connection with FIG. 6.

Figure 6:
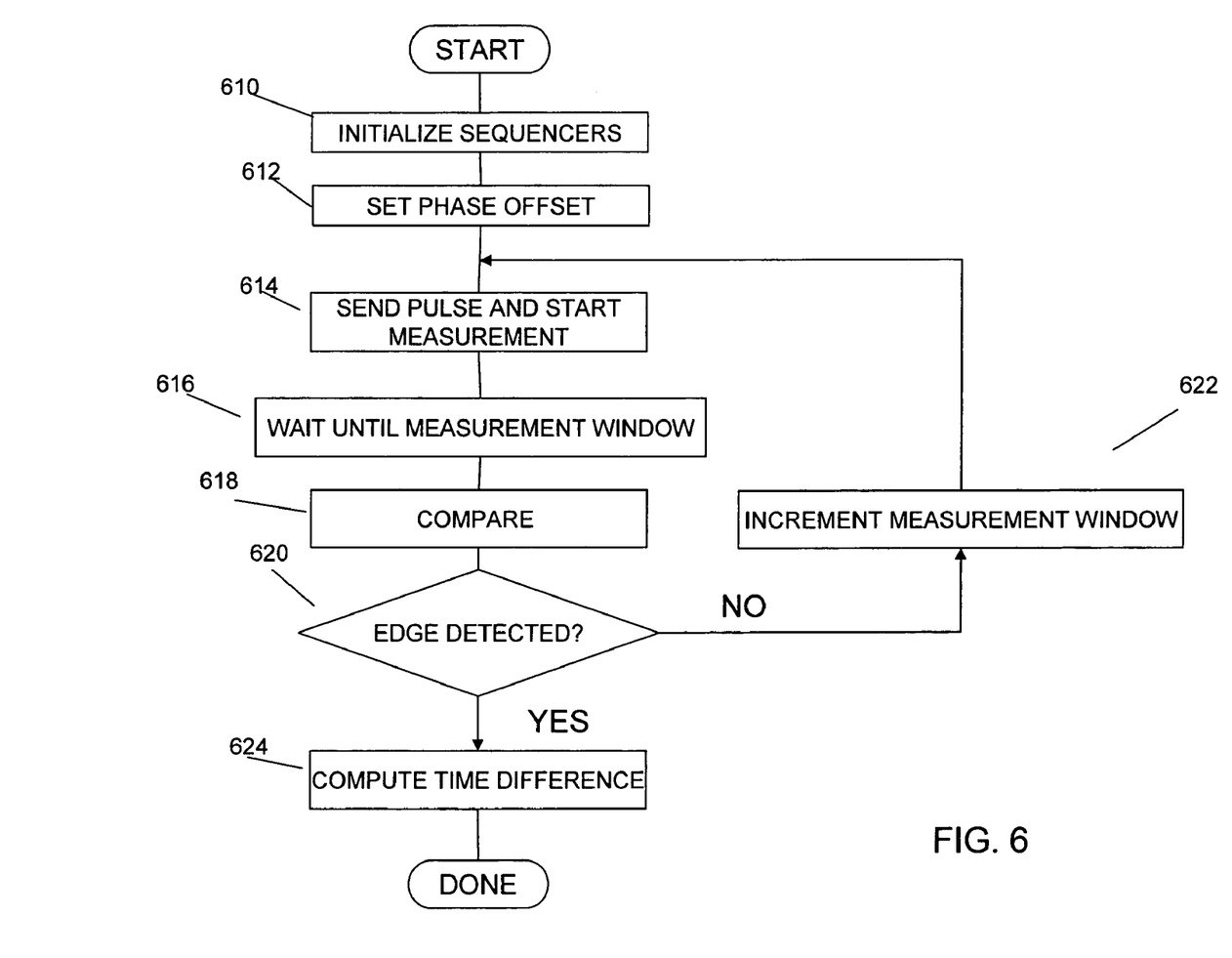
FIG. 6 is a flow chart of a time measurement process according to the invention.

FIG. 6 illustrates a process by which circuitry such as is shown in FIG. 5 might be used for forming a TDR measurement. At step 610 sequencers 550A and 550B are initialized for the measurement.

At step 612, NCO's 510A and 510B are programmed to generate clocks of the same frequency, but with a different phase. This phase offset may be introduced by storing an initial value in the accumulator 422 of NCO 510B.

At step 614, a pulse is transmitted on line $170_1$. In the embodiment of FIG. 5, sequencer 550A generates this pulse in response to a D_SYNC signal, which acts as a start measurement command. The start measurement command also triggers sequencer 550B to start monitoring the values in the accumulator register of NCO 510B.

At step 616, the process waits until a programmed measurement window is reached. As described above in connection with FIG. 3A ... 3C, an "edge find" algorithm may be implemented by changing the time of a measurement window until times immediately before and immediately after the edge are detected. The measurement operation is repeated with many programmed times for the measurement window until the edge is detected. As described above in FIG. 5, the time of the measurement window is determined by sequencer 550B monitoring the values within NCO 510B. At the compare time, sequencer 550B issues a pulse that is aligned in flip flop 552B and then passed to pin electronics 160. This pulse triggers the comparison operation, as indicated at step 618.

At step 620 the output of the comparator is processed by sequencer 550B to determine if it represents an edge. An edge may be detected by locating a measurement window for which comparator 166 indicates the value on line $170_1$ exceeds the threshold that is stored in register 168 when the value immediately preceding measurement window is below that threshold. If the edge is not detected at step 620, processing proceeds to step 622.

At step 622, the time of the measurement window is incremented. The time of the measurement window can be incremented in multiple ways. Sequencer 550B might be programmed to indicate the end of the measurement interval based on accumulator register 622 in NCO 510B reaching a higher value. Sequencer 550B might alternatively be programmed to count more overflows of the accumulator register 422 in NCO 510B before issuing a pulse to flip-flop 552B. Alternatively, the initial phase difference between NCO 510A and 510B might be increased.

These forms of adjustment might all be used to provide relatively big changes in the measurement interval or relatively small changes. Adjusting the number of overflows of accumulator register 422 in NCO 510B might be considered a course adjustment of the measurement window. Incrementing the relative phase difference between NCO 510A and 510B might be considered to be a relatively fine adjustment of the time of the measurement window.

An NCO, such as shown in FIG. 4, might have a phase accumulator with many bits of resolution, allowing very precise control over the measurement window. For example, with an NCO having 48 bits of resolution and a clock on the order of 100 MHz, sub-picosecond measurement accuracy is possible. Circuitry with resolutions conventionally found in a semiconductor tester can readily produce measurement accuracies of a few hundred femtoseconds and such circuitry might easily include a resolution sufficient to measure times with precision in the attosecond range.

The process shown in FIG. 6 repeats iteratively through the loop that involves steps 614, 616, 618, 620 and 622. This loop is repeated until a measurement window in which an edge is detected. At this point, processing proceeds to step 624. At step 624, computation is made reflecting the difference in time between when the pulse is transmitted on line $170_1$ and the edge indicating the reflection of that pulse was detected. The computed time difference reflects the number of full cycles through accumulator register 422, the fraction of a cycle through accumulator register 422 and the phase offset that was initially programmed between NCO 510A and 510B. Because NCO 510B increases a known amount for each cycle of MCLK, the computed value can be converted to an actual time. This time measurement can have a very high resolution. If the value in phase increment register 426 is represented as a fraction, the resolution of this measurement is equal to the value of the least significant bit in phase increment register 426 multiplied by the period of MCLK.

Having thus described several aspects of at least one embodiment of this invention, it is to be appreciated various alterations, modifications, and improvements will readily occur to those skilled in the art.

For example, two sequencers 550A and 550B are shown. The control functions described above might be allocated to hardware or software in any convenient manner. The described embodiment provides the advantage of allowing pulse generation circuits 500A and 500B to have similar designs. But, a single sequencer might control the entire measurement process. Alternatively, some of the control functions might be implemented in the pattern generator or other control circuitry.

As a further example, it is described that the relative phase of the clocks generated in pulse generation circuits 500A and 500B is controlled by offsetting the phase of the clocks generated in pulse generation circuit 500B. A relative phase different could be introduced by changing the phase in either circuit.

As another example, it is described that a single measurement that indicates a logic HI is sufficient to identify an edge. More data might be used to reduce the impact of noise on the measurement process. One way to achieve this result is to indicate an edge only when a sequence of HI values is received following a LO-to-HI transition.

Alternatively, the measurement might be repeated multiple times for each measurement window. Each measurement window would have multiple values associated with it, allowing a form of averaging to reduce the effects of noise. In the measurement window during which the signal value equals the threshold, a small amount of noise could make the comparator output above the threshold or below the threshold. Repeating the measurement in the same measurement window would result in the measurement being sometimes LO and sometimes HI. When the signal value is equal to the threshold and uniformly distributed random noise is present, the value would be HI about 50% of the time and LO 50% of the time. By looking for a measurement window in which the signal is 50% HI and 50% LO, an edge can be accurately detected in the presence of noise.

Also, it should be appreciated that the described order of steps is not critical. The time difference computed at step 624 might, for example, be part of the step 622 incrementing measurement window. Alternatively, step 620 need not be in the loop that is performed iteratively. Data might be collected on all possible measurement windows first, with the data being subsequently processed to find the measurement window containing an edge.

Such alterations, modifications, and improvements are intended to be part of this disclosure, and are intended to be within the spirit and scope of the invention. Accordingly, the foregoing description and drawings are by way of example only.

What is claimed is:

1. Time measurement apparatus comprising:
    a) a first clock generation circuit outputting a first clock signal, the first clock generation circuit comprising a first numeric counter oscillator;
    b) a second clock generation circuit outputting a second clock signal, the second clock generation circuit comprising a second numeric counter oscillator;
    c) a clock input coupled to the first numeric counter oscillator and the second numeric counter oscillator, the clock input controlling the rate at which the first numeric counter oscillator and the second numeric counter oscillator increment;
    d) at least one sequencer controlling the operation of the time measurement apparatus, the at least one sequencer generating a first control signal synchronized to the first clock signal and a second control signal synchronized to the second clock signal.

2. The time measurement apparatus of claim 1 wherein the first clock generation circuit and the second clock generation circuit comprise a first direct digital synthesis circuit and a second direct digital synthesis circuit, respectively.

3. The time measurement apparatus of claim 1 wherein the first clock generation circuit additionally comprises a look-up table having an address input and an output, and the output of the first numeric counter oscillator is applied to the address input of the look-up table.

4. The time measurement apparatus of claim 3 wherein the first clock generation circuit additionally comprises an digital to analog converter having a digital input and an analog output, and the digital input is coupled to the output of the look-up table.

5. The time measurement apparatus of claim 4 wherein the second clock generation circuit additionally comprises a second look-up table having an address input and an output, and the output of the second numeric counter oscillator is applied to the address input of the second look-up table.

6. The time measurement apparatus of claim 5 wherein the second clock generation circuit additionally comprises a second digital to analog converter having a digital input and an analog output, and the digital input is coupled to the output of the second look-up table.

7. The time measurement apparatus of claim 1 additionally comprising a driver circuit having a timing input and a measurement circuit having a timing input, wherein the timing input of the driver circuit is coupled to the first control signal and the timing input of the measurement circuit is coupled to the second control signal.

8. The time measurement apparatus of claim 7 wherein the measurement circuit comprises a comparator.

9. The time measurement apparatus of claim 8 wherein the driver circuit and the comparator circuit comprise pin electronics in a channel of automatic test equipment for semiconductor devices.

10. The time measurement apparatus of claim 7 additionally comprising a first flip-flop having a clock input and an output coupled to the driver and a second flip-flop having a clock input and a data input coupled to the comparator, the clock input of the first flip-flop coupled to the first control signal and the clock input of the second flip-flop coupled to the second control signal.

11. A method of measuring a time difference comprising:
    a) generating a first clock having a first frequency, the frequency controlled in response to at least one value;
    b) generating a second clock having a second frequency, correlated to the first frequency, with the frequency and phase of the second clock relative to the phase of the first clock being controlled in response to at least one digital value;
    c) starting a measurement interval synchronized to the first clock; and
    d) ending the measurement interval synchronized to the second clock.

12. The method of measuring a time difference of claim 11 wherein the first clock and the second clock have the same frequency and a different phase.

13. The method of claim 11 additionally comprising:
    comparing a signal to a value defining an event at the end of the measurement interval.

14. The method of claim 13 additionally comprising:
    repeating for a plurality of iterations the steps of generating a first clock, generating a second clock, starting a measurement interval, ending the measurement interval and comparing the signal; and
    wherein, for each of the plurality of iterations, the phase of the second clock relative to the first clock is controlled to provide a different relative phase.

15. The method of claim 13 additionally comprising:
    collecting a data set by repetitively starting a measurement interval; ending the measurement interval and comparing the signal value and a value in the data set is generated for each comparison; wherein,
    i) for each of the plurality of repetitions, the phase of the second clock relative to the first clock is controlled to provide the same relative phase;
    ii) comparing a signal comprises comparing the signal to a binary threshold and an event is defined by the data set having a specified percentage of values of a first digital value.

16. The method of claim 11 additionally comprising:
    a) transmitting a signal at the beginning of the measurement interval; and
    b) measuring a signal at the end of the measurement interval.

17. The method of claim 16 wherein the time measurement is used in a TDR measurement.

18. A method of measuring a time difference comprising:
    a) generating a first clock having a first frequency, the frequency controlled in response to at least one digital value;
    b) generating a second clock having a second frequency, correlated to the first frequency, with the frequency and phase of the second clock relative to the phase of the first clock being controlled, in response to at least one digital value;
    c) starting a measurement interval synchronized to the first clock;

d) ending the measurement interval synchronized to the second clock;

wherein the first clock and the second clock have the same frequency and a different phase;

wherein the first clock is generated with a first direct digital synthesis circuit including a first numeric counter oscillator having a first phase increment register and the second clock is generated with a second direct digital synthesis circuit including a second numeric counter oscillator having a second phase increment register; and wherein generating a first clock and a second clock comprises loading the same value into the first and second phase increment registers.

19. The method of measuring a time difference of claim 18, wherein the first numeric counter oscillator has a first phase accumulator register and the second numeric counter oscillator has a second phase accumulator register, wherein generating a first clock and a second clock comprises initializing the first phase accumulator register and the second phase accumulator register to have different values.

20. A method of measuring a time difference comprising:
a) generating a first clock having a first frequency, the frequency controlled in response to at least one digital value;

b) generating a second clock having a second frequency, correlated to the first frequency, with the frequency and phase of the second clock relative to the phase of the first clock being controlled, in response to at least one digital value;

c) starting a measurement interval synchronized to the first clock;

d) ending the measurement interval synchronized to the second clock;

wherein the first clock and the second clock have the same frequency and a different phase;

wherein the first clock is generated with a first direct digital synthesis circuit including a first numeric counter oscillator having a first phase accumulator register, and the second clock is generated with a second direct digital synthesis circuit including a second numeric counter oscillator having a second phase accumulator register; and wherein generating a first clock and a second clock comprises initializing the first phase accumulator register and the second phase accumulator register to have different values.

* * * * *